United States Patent [19]

Bryce

[11] Patent Number: 4,655,517

[45] Date of Patent: Apr. 7, 1987

[54] ELECTRICAL CONNECTOR

[75] Inventor: J. Robert Bryce, Fairport, N.Y.

[73] Assignee: Crane Electronics, Inc., Cincinnati, Ohio

[21] Appl. No.: 701,950

[22] Filed: Feb. 15, 1985

[51] Int. Cl.⁴ .............................................. H01R 9/09
[52] U.S. Cl. ........................... 339/17 LC; 339/125 R; 339/276 SF; 411/510
[58] Field of Search ................ 339/17 R, 17 C, 17 L, 339/17 LC, 17 CF, 59 M, 125 R, 126 R, 126 RS, 128, 132 R, 132 B, 276 SF, 198 R, 198 C, 176 M, 176 MP; 411/508–510; 174/138 D, 138 G

[56] References Cited

U.S. PATENT DOCUMENTS

| | | | |
|---|---|---|---|
| 3,099,704 | 7/1963 | Naimer | 411/907 |
| 3,409,857 | 11/1968 | O'Neill et al. | 339/17 |
| 3,525,972 | 8/1970 | Asick et al. | 339/64 |
| 3,621,444 | 11/1971 | Stein | 339/14 |
| 3,723,943 | 3/1973 | Hotze | 339/17 CF |
| 3,732,529 | 5/1973 | Weisenburger | 339/192 R |
| 3,832,770 | 9/1974 | Gluntz | 29/884 |
| 3,866,997 | 2/1975 | Kreutter et al. | 339/217 S |
| 3,897,131 | 7/1975 | Stauffer | 339/220 R |
| 3,920,302 | 11/1975 | Cutchaw | 339/176 MP |
| 3,966,290 | 6/1976 | Little et al. | 339/17 LC |
| 3,975,076 | 8/1976 | Shida et al. | 339/125 R |
| 3,999,827 | 12/1976 | Hutchison et al. | 339/17 CF |
| 4,010,992 | 3/1977 | Crimmins et al. | 339/17 CF |
| 4,056,300 | 11/1977 | Schumacher | 339/103 R |
| 4,080,028 | 3/1978 | Gilbert | 339/17 L |
| 4,195,900 | 4/1980 | Hughes | 411/508 |
| 4,230,387 | 10/1980 | Zahn | 339/59 R |
| 4,286,837 | 9/1981 | Yasutake et al. | 339/176 M |
| 4,364,618 | 12/1982 | Godsey | 339/17 LC |
| 4,391,482 | 7/1983 | Czeschka | 339/59 M |
| 4,401,355 | 8/1983 | Young | 339/17 LC |
| 4,410,230 | 10/1983 | SanMiguel | 339/176 M |
| 4,428,640 | 1/1984 | Pittman | 339/17 LC |
| 4,435,031 | 3/1984 | Black et al. | 339/17 C |
| 4,473,204 | 9/1984 | Bohm | 248/1 |
| 4,494,308 | 1/1985 | Schauer | 339/17 R |
| 4,553,801 | 11/1985 | Zajeski | 339/59 M |

FOREIGN PATENT DOCUMENTS

| | | | |
|---|---|---|---|
| 937880 | 12/1973 | Canada | 411/510 |
| 2006465 | 12/1970 | Fed. Rep. of Germany . | |
| 912304 | 12/1962 | United Kingdom | 339/198 R |

OTHER PUBLICATIONS

Circuit Assembly Corp., Irvine, California, Catalog No. 8411, p. 60.

Primary Examiner—Neil Abrams
Attorney, Agent, or Firm—Wood, Herron & Evans

[57] ABSTRACT

An electrical connector including an insulator and a number of contacts for mounting on a substrate such as a printed circuit board. As disclosed, the electrical connector includes an elongated insulator block carrying contacts in the form of pins, an end of each of which is received in a printed circuit board aperture to be soldered to the printed circuit board. The elongated insulator block further includes a series of holes, each intermediate an adjacent pair of contacts of the connector, precisely located relative to the contact locations, to facilitate positioning the connector for insertion of the pins into a printed circuit board. The insulator block is notched adjacent each of the holes to facilitate breaking the connector to a desired length, and hence containing a desired number of contacts. The insulator block further has generally semi-cylindrical indentations at each of its ends. To mechanically secure the electrical connector to a printed circuit board, prior to soldering of the contact pins thereto, a peg is inserted through one of the holes in the insulator into gripping engagement with the walls of an aperture in the printed circuit board.

23 Claims, 13 Drawing Figures

ELECTRICAL CONNECTOR

BACKGROUND OF THE INVENTION

This invention relates generally to electrical connectors including an insulator carrying a number of electrical contacts, and more particularly concerns such electrical connectors for mounting on a substrate such as a printed circuit board.

Many types of electrical connectors are employed for interconnecting electrical and electronic systems, and subsystems and components thereof. Such electrical connectors typically include an insulating body, or insulator, as well as a number of electrical contact elements mounted in or on the insulator. Each contact of the electrical connector usually provides a separate electrical connection path between two system locations such as circuit junctions, semiconductor device terminals or the like.

One common type of electrical connector includes an insulator carrying electrical contacts adapted to make electrical connections to a substrate, such as a printed circuit board. In such connectors adapted for mounting on a printed circuit board, the contacts each typically include an end portion either in the form of a pin extending beyond the insulator to be received in an aperture in the printed circuit board or in the form of a contact surface for surface mounting the connector on the board. The connector is ultimately maintained in position on the printed circuit board by soldering the contacts to conductive paths on the board. For connectors having pins, the pins are usually soldered to the board in a wave soldering operation during which electrical components, including the connector, which are positioned on the board are soldered thereto.

In the past, such electrical connectors for printed circuit boards have often been mounted on the board manually. For example, for the pin-mounted connectors, an operator may visually guide the pins into the apertures on the board. After positioning the electrical connector on the board, prior to soldering, the connector is then often mechanically secured in place by temporary means such as by placing tape or weights on the connector. This prevents disengagement of pins from the board prior to soldering and, most importantly, during the soldering operation itself.

For some types of connectors, usually shrouded connectors having a sizable insulator body, large nuts and bolts, or rivets, have been employed to mechanically secure the connector to a printed circuit board. However, employment of such a bolt, screw, rivet or the like requires the provision of a correspondingly located opening in the printed circuit board to receive the fastening element. The provision of such an opening imposes an additional design constraint of the printed circuit board layout.

Several such mechanical fasteners for electrical connectors associated with printed circuit boards or other substrates are shown in U.S. Pat. No. 3,525,972 to Asick et al, U.S. Pat. No. 3,621,444 to Stein, U.S. Pat. No. 3,966,290 to Little et al, U.S. Pat. No. 4,010,992 to Crimmins et al, U.S. Pat. No. 4,435,031 to Black et al, and U.S. Pat. No. 4,410,230 to San Miguel. The Little et al patent, for example, shows the use of a plastic rivet to secure a shrouded connector to a printed circuit board and the Black et al patent shows the use of a plastic snap latch for connecting a connector block to a circuit board or other support structure.

U.S. Pat. No. 3,409,857 to O'Neill et al and U.S. Pat. No. 3,732,529 to Weisenburger show connectors including legs or posts on a connector insulator received in openings in a substrate. U.S. Pat. No. 3,832,770 shows means for staking a terminal cover to a circuit board, and U.S. Pat. No. 3,999,827 shows the use of posts to hold a semiconductor package on a connector socket.

An investigation of the electrical connector art has brought to light certain other patents and existing connectors. For example, elongated connectors for mounting on substrates such as printed circuit boards are known which include notches or grooves in an insulator body intermediate the connector contacts, to permit breaking the connector to a desired length. Exemplary connector structures of this type are shown in U.S. Pat. No. 4,230,387 to Zahn and U.S. Pat. No. 4,391,482 to Czeschka. U.S. Pat. No. 4,056,300 to Schumacher shows a terminal connector having stress relief openings between the lands carrying pressure fitted terminals in an insulator block. The notches relieve stress in the insulator and reduce longitudinal extension and bowing of the insulator. It is also known to introduce holes along an insulator of a connector to reduce stress and bowing of the insulator during pin insertion into the insulator and during soldering of the connector to a circuit board.

Connector structures in which openings are provided in an insulator block to permit access to the contacts are shown in German Pat. No. 2,006,465, U.S. Pat. No. 3,866,997 to Kreutter et al, and U.S. Pat. No. 4,286,837 to Yasutake et al. In Yasutake et al openings are provided in a connector block for receiving claws of an insertion jig. In U.S. Pat. No. 3,897,131 to Stauffer, a two-piece connector housing receives pin-like contact terminals which include peripherally extending flanges for securing the portions of the housing together.

It is one general aim of the present invention to provide, in an electrical connector of the type to be mounted on a substrate such as a printed circuit board, an improved means for mechanically securing the connector to the substrate prior to soldering.

It is a further general aim of the invention to provide such a connector which includes improved means for positioning the connector relative to a substrate.

SUMMARY OF THE INVENTION

In accordance with one aspect of the invention, an electrical connector for mounting on a substrate such as a printed circuit board is provided which includes an insulator and a plurality of contacts carried by the insulator, wherein the insulator includes a plurality of holes therethrough, each adapted to receive a peg which is placed in a selected one of the holes and which mechanically engages an aperture in the substrate. In this way, the electrical connector may be universally mounted on a substrate, such as a printed circuit board, having an infinite variety of layouts of conductive paths thereon, with a peg-engaging aperture located in the substrate in alignment with only the selected hole of the plurality of holes in the connector insulator.

In accordance with a further aspect of the invention, the electrical connector includes a plurality of holes precisely positioned relative to the contacts in the connector insulator body so that the holes may be used for positioning the insulator body, such as for handling the connector before mounting or for the alignment of the connector with a substrate such as a printed circuit board.

In some embodiments of the invention, to be described more particularly hereinafter, the connector insulator further includes a series of notches adjacent the openings through the insulator in order to permit breaking the insulator body to provide connectors of different lengths. The notches cooperate with the openings to provide convenient break points, or planes of weakness, for a substantially clean break of the insulator body, and also permit the provision of connectors having generally cylindrical indentations, precisely located relative to the locations of the contacts, at each of the ends of the insulator. The notches are preferably precisely located relative to the holes and may themselves be used for positioning the connector.

Other objects and advantages of the invention, and the manner of their implementation, will become apparent upon reading the following detailed description and upon reference to the drawings, in which:

FIG. 10 is a side view of the peg of FIG. 2a;

FIG. 11 is a top view of the peg of FIG. 10; and

Figure 1:
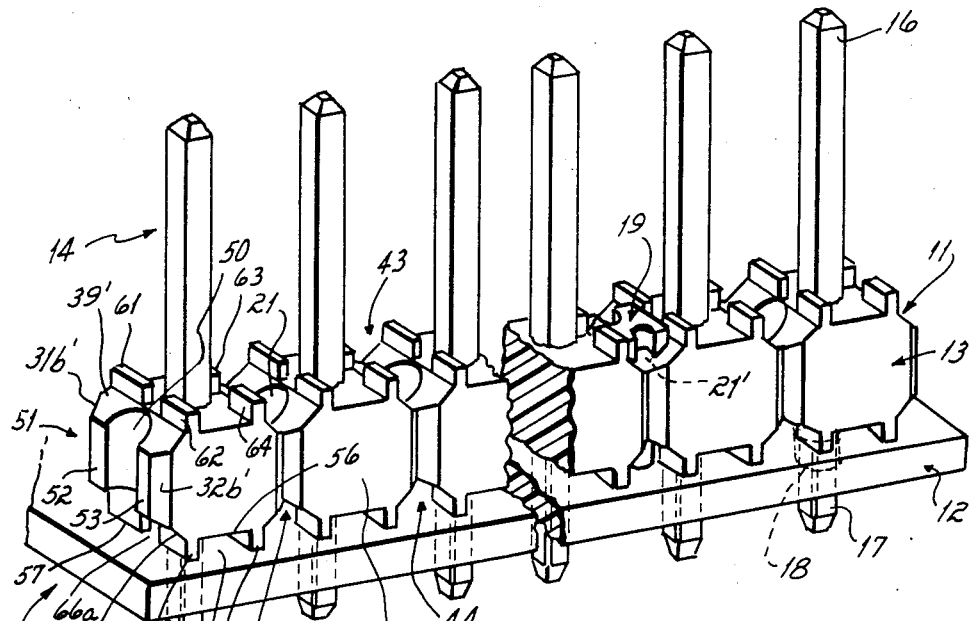
FIG. 1 is a perspective view of an electrical connector in accordance with the present invention.

While the invention is susceptible to various modifications and alternative forms, certain illustrative embodiments have been shown by way of example in the drawings and will herein be described in detail. It should be understood, however, that it is not intended to limit the invention to the particular form disclosed, but, on the contrary, the intention is to cover all modifications, equivalents, and alternatives falling within the spirit and scope of the invention, as defined by the appended claims.

With initial reference to FIGS. 1-5, an electrical connector assembly 10 includes an electrical connector 11 secured to a printed circuit board 12. The connector 11 includes an insulator body 13 and a row of electrically conductive pins 14 carried by the insulator body. In the illustrated connector 11, the pins 14 are fixedly secured in the insulator 13 and arranged in a straight row equally spaced apart from one another along the row. The pins 14 extend out of the insulator 13 so that each pin 14 includes an exposed upper end portion 16 (suited to receive, for example, a cable receptacle) and a lower end portion 17. The lower end portion 17 of each pin 14 is received within an aperture 18 through the printed circuit board 12. In practice, conductive paths (not shown) on the printed circuit board 12 make electrical contact with the contact portions 17 of the pins 14.

In order to accomplish this, after the connector 11 is mounted on the printed circuit board 12 by insertion of the contacts 17 through the apertures 18 to form a connector assembly 10, the connector 11, and other electrical components mounted on the printed circuit board, are soldered to the board, usually in a wave soldering operation. Normally the apertures 18 in the printed circuit board are "plated-through" holes to facilitate proper soldering of the contacts to the board. As thus far described, the electrical connector 11 is a substantially conventional unshrouded header for mounting on a printed circuit board.

In order to secure the connector 11 to the printed circuit board 12 prior to soldering, a non-conductive peg 19 is inserted into a selected hole 21' in a row of holes 21 through the insulator 13. The holes 21 are in line with the pins 14 and intermediate each adjacent pair of pins. In the illustrated connector 11, these holes 21 are precisely located relative to the locations of the pins in the insulator 13, with the holes 21 being half way between each adjacent pair of pins 14. In one form of the connector 11, each hole 21 is precisely located relative to an adjacent pin within a tolerance of 2%, with offsets within the tolerance being non-accumulative along the length of the insulator 13.

Figure 2A:
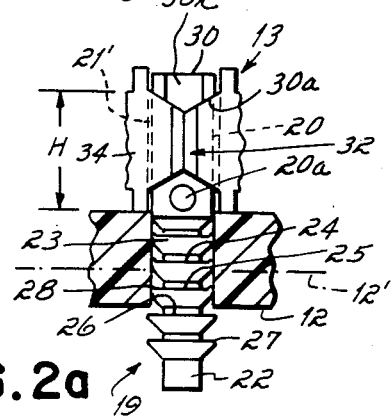
FIG. 2a is a cross-sectional view of a portion of the connector of FIG. 1.

The peg 19 is sized to pass relatively freely through the hole 21' in the insulator 13 and includes a lower portion 22 having a series of flanges 23-27. The flanges are positioned along the peg 19 so that, as illustrated in FIG. 2a, portions of the flanges 23, 24, and 25 are received within an aperture 28 in the printed circuit board 12, frictionally engaging the inner wall of the aperture.

Figures 10, 11:
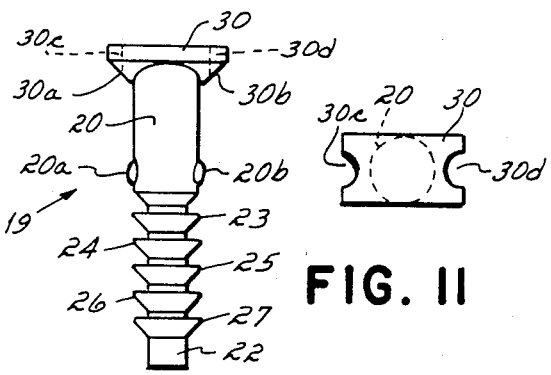

With additional reference to FIGS. 10 and 11, the peg 19 includes a generally cylindrical upper portion 20, a generally cylindrical, reduced diameter lower portion 22, and an uppermost head portion 30, extending generally transverse to the upper portion 20 to form a "T". The lower portion 22 of the peg 19 typically extends through and beyond the board 12, with at least some of the flanges 23-27 engaging the interior of the aperture 28 in the board. The upper portion 20 of the peg 19 typically is received in the hole 21' within the insulator 13. The upper portion 20 of the peg 19 further includes two relatively small bumps 20a, 20b extending beyond its surface to tend to stabilize and hold the peg into wafer the peg 19 in the hole 21', before the peg is fully inserted, without significantly affecting the free insertion of the peg through the hole. The head 30 of the peg 19 extends laterally beyond the hole 21', having shoulders 30a, 30b, which engage the insulator 13 when the peg is fully inserted into the hole 21'. In the present form of the peg 19, the head 30 includes two generally semi-cylindrical indentations 30c, 30d in its ends to facilitate gripping the peg for insertion through the insulator 13 and the board 12. The portions of the head 30 of the peg 19 engaging the insulator beyond the hole 21' are tapered to fit into a V-shaped notch in the top of the insulator, to be described more particularly hereinafter.

With the peg 19 fully inserted into the hole 21' in the insulator 13, and the flanges on the lower portion 22 of the peg gripping the interior of the printed circuit board aperture 28, the connector 11 is mechanically secured to the printed circuit board 12.

By means of this mechanical securement by the peg 19 of the electrical connector 11 to the printed circuit board 12, the connector is maintained in position on the board during handling of the board prior to a soldering operation. In addition, during the soldering operation, such as a wave soldering operation, the mechanical securement of the connector to the board substantially prevents "lifting" of the connector, or an end of the connector, from the board during soldering due to upward forces exerted by the solder on the connector. Preferably, the peg 19 is a material such as nylon so that the lower portion of the peg "balls up" beneath the board during soldering rather than falling into the solder.

The electrical connector 11 may be made in a particular custom length, by forming the insulator 13 to the proper length. The connector 11 would consequently have a desired number of pins 14, based upon the insulator length. However, preferably an elongated stock connector, containing for example a row of 40 pins, is provided to a user of connectors such as the connector 11. Such a stock connector is then broken by the user into individual connectors 11 of desired lengths.

In order to facilitate this breaking of the connector, there are a pair of notches 31, 32 in the sidewalls 33, 34, respectively, of the insulator 13 at each hole 21. The walls 31a, 31b and 32a, 32b of the notches 31, 32 extend inwardly to innermost lines 31c and 32c lying in a plane of weakness 36 through each hole 21. The plane of weakness 36 is perpendicular to an axial bisecting plane 37 through the insulator body 13, with each plane 36, 37 passing through the center of a hole 21.

On each side of each hole 21, the insulator 13 further includes upper and lower inclined surfaces 38, 39 and 41, 42, respectively. The inclined surfaces 38 and 39 and the inclined surfaces 41 and 42, meet along lines which also lie within the plane of weakness 36. The upper inclined surfaces form an upper notch 43 above each opening 21, and the inclined surfaces 41, 42 form a lower notch 44 below the opening 21.

The notches around each opening 21, all lying in the plane of weakness 36, provide a location at which a stock connector may be broken to produce an electrical connector 11 having a desired length. Due to the reduced cross-section of the insulator 13 at the plane of weakness, a relatively "clean" break is effected, approximately coincident with the plane 36.

Preferably, each electrical connector 11 has two similarly configured ends, each of which is either formed through the above-mentioned breaking procedure, or originally formed during molding of the insulator, to substantially the same shape. Thus, for example, at the end 51 of the connector 11, there is a semicylindrical indentation 50, a lateral angled surface 31b', a lateral angled surface 32b', an upper angled surface 39', and a lower angled inclined surface 42'. On either side of the indentation 50 are end surfaces 52, 53, which in the case of a formed connector end are smooth. These surfaces are precisely positioned relative contact 14 and may be utilized, therefore, for automatic machine insertion of the connector. Indeed, each of holes 21 is precisely located relative contact 14 to permit precisely locating connector 11 relative a printed circuit board to permit automatic machine insertion of the connector. Moreover, because notches 31,32 are also precisely located along the cylindrical axis of a related hole, notches 31,32 may also be utilized for automatic machine insertion of the connector. In any event, if the end 51 of the connector 11 has been created by breaking the connector from a stock connector body, such as along a plane of weakness 36, the surfaces 52 and 53 are irregular, having been broken away from the stock connector.

The insulator body 13 of the electrical connector 11 further includes, extending from its lower surface 56, four stand-offs, such as 57, 59 and 60 surrounding each pin 14. Extending above the upper surface 58 of the insulator 13 are four similarly located "stand-offs" 61–64 surrounding the pin. In the form of connector 11 illustrated, the insulator 13 is symmetrical (about a plane passing between its lower half and its upper half). Therefore, the insulator 13 may be inverted from the orientation shown prior to the insertion of the pins 14 in the insulator, without altering the form and function of the connector.

Figure 5:
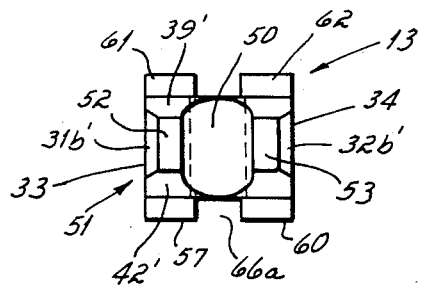
FIG. 5 is an end view of the insulator of the connector of FIG. 1.

As best seen in FIG. 5, the spacing between the lower stand-offs such as 57, 60, produces a channel 66a beneath the lower surface 56 of the insulator 13 communicating with the pin 14. Similarly, the stand-offs such as 59, 60 cooperate to provide a channel 66b, transverse to the channel 66a, below the lower surface 56, also communicating with the pin 14. In soldering electrical components, including the connector 11, to the printed circuit board 12, the channels surrounding each pin permit free flow of solder - washing fluids after a soldering operation.

Figure 12:
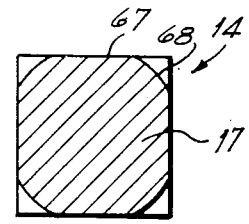
FIG. 12 is an enlarged cross-sectional view upwardly of the lower portion of a pin of the connector of FIG. 1.
Figure 3:
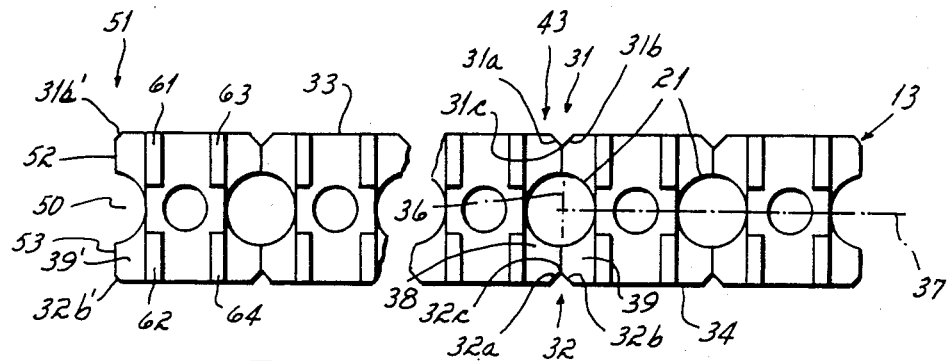
FIG. 3 is a top plan view of the insulator of the connector of FIG. 1.
Figure 4:
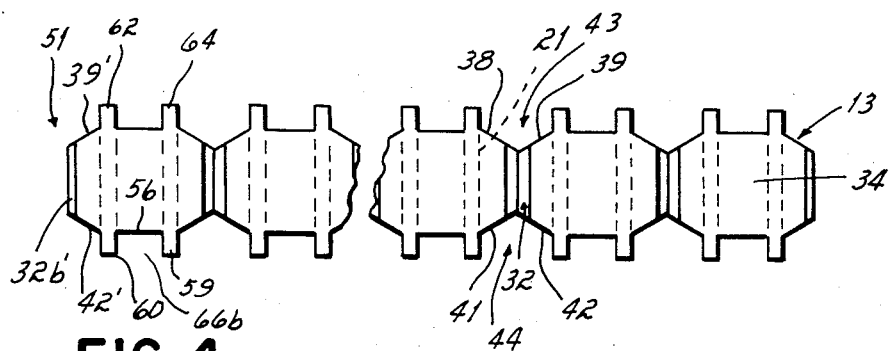
FIG. 4 is a side elevational view of the insulator of the connector of FIG. 1.

With reference now to FIG. 12, the lower portion 17 of each pin 14 is of generally square cross-section, in conformity with the upper portion 16 of each pin. A pin 14 used in one particular form of connector 11 has an upper portion 16 wherein each side 67 is about 0.0265 inches in width, after plating. Typically the pins in connectors such as the connector 11 are plated, such as with gold over nickel, or tin over nickel, depending upon the application.

In the lower portion 17 of the pin 14, the diagonals of the square cross-section of the pin are pressed to form four narrow faces 68 on the lower portion of the pin. This compression reduces each "diagonal" of an originally-square pin, in the above-mentioned particular form of connector 11, to about 0.028 inches.

Normally, a printed circuit board for receiving the lower portions 17 of the pins includes holes 18 having a generally circular, or cylindrical, form properly aligned to receive the pins. The apertures 18 for a particular connector assembly 10 are 0.040 inches in diameter before plating, and about 0.035 to 0.037 inches after the board apertures are plated through.

The aperture 28 for receiving the peg 19, in the aforementioned particular form of connector assembly 10, is preferably an unplated hole having a diameter of about 0.040 inches.

The peg for this particular assembly 10 is nylon and includes a lower portion 22 having a diameter of about 0.026 inches. The flanges 23–27 are generally annular having a greatest width dimension of about 0.046 inches. The upper portion 20 of the peg 19 has a diameter of about 0.042 inches, with the widest dimension of the upper portion 20, at the location of the diametrically opposed bumps 20a, 20b, being about 0.051 inches. The longest dimension of the transverse head 30 on the peg 19 is about 0.080 inches. The holes 21 through the insulator 13 for receiving a peg 19, in this particular form of connector assembly, have a diameter of about 0.048 inches.

Figure 6:
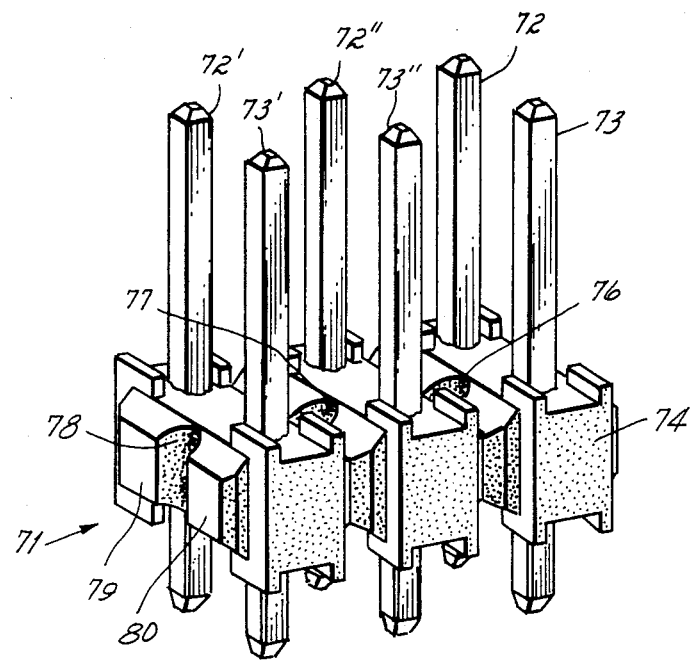
FIG. 6 is a perspective view of an alternative form of connector in accordance with the present invention.

With reference now to FIG. 6, a double row electrical connector 71 includes a first row of pins 72 and a second row of pins 73 in an insulator 74. A single row of holes 76 is provided in the insulator 74 between the two rows of pins 72, 73 for receiving a peg such as the peg 19.

Adjacent pins, such as 72' and 73', are located side by side in a common plane perpendicular to the lengthwise dimension of the insulator 74. Similarly, the pins 72" and 73" are located side by side in a common plane along the insulator parallel to the plane of the pins 72', 73'. Intermediate these two planes, along the longitudinal axis of the insulator, is a hole 77 for receiving a peg to secure the connector 71 to a printed circuit board. A hole 76, like the hole 77, and other holes intermediate other pairs 72, 73 of pins along the connector, also lies along the center line of the insulator 74, precisely intermediate the planes of the adjacent pairs of pins, 72, 73 and 72", 73".

As in the case of the connector 11, in the insulator block 74 of the connector 71, at each hole 76, 77, there are top, bottom, and lateral notches forming a plane of weakness to permit breaking the connector at a desired location. Each end of the connector 71 includes a semi-cylindrical indentation 78 between two reduced area surfaces 79, 80 of the insulator block 74, analogous to the surfaces 52, 53 of the connector 11. The insulator block 74 also includes four standoffs on the lower surface of the insulator surrounding each pair of pins 72, 73.

Figure 7:
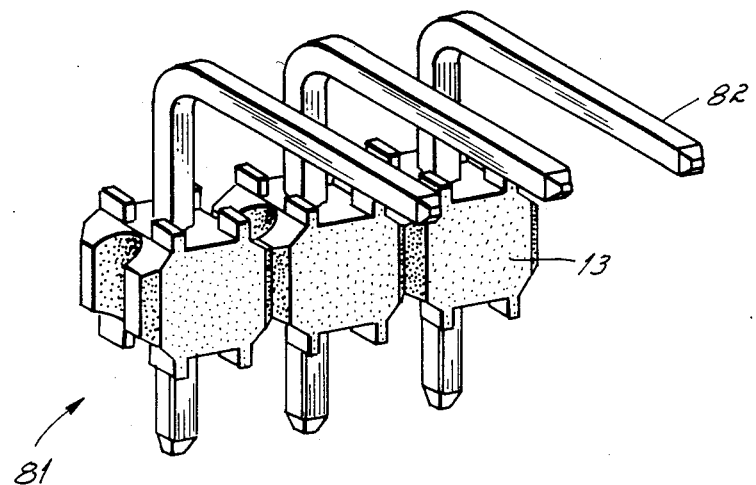
FIG. 7 is a perspective view of another alternative form of connector in accordance with the present invention.

FIG. 7 illustrates a high profile right angle, single row connector 81, employing an insulator block of the same type as the insulator 13 of the connector 11. In the connector 81, the upper portions of the pins 82 are formed at a right angle relative to the lower portion of each pin, but in all other respects the connector 81 is constructed in the same fashion as the connector 11.

Figure 8:
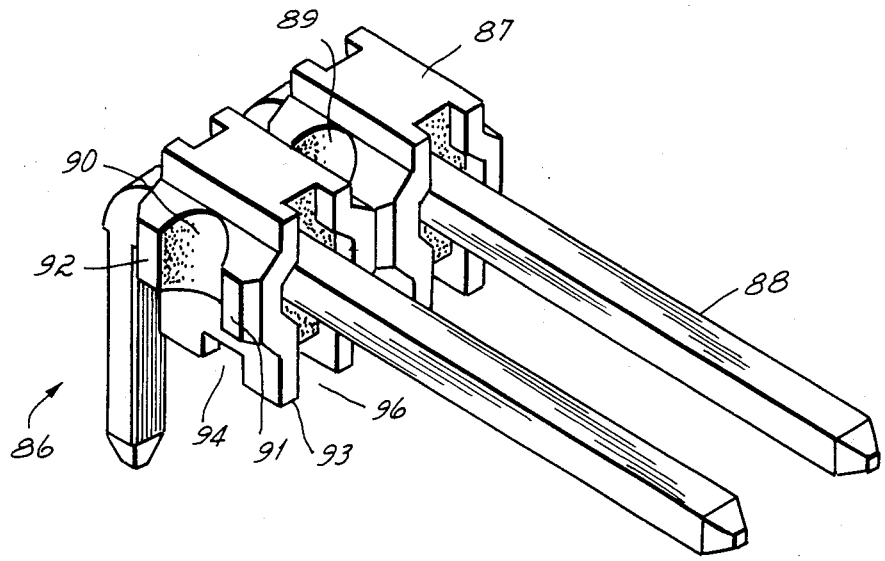
FIG. 8 is a perspective view of another alternative form of connector in accordance with the present invention.

With reference now to FIG. 8, a low profile, right angle, single row connector 86 includes an insulator 87 and a series of pins 88 carried by the insulator. As in the case of the electrical connector 11, the insulator 87 includes top, bottom and lateral notches around each of a series of holes 89 precisely spaced along the insulator 87 intermediate the pins 88. The top, bottom and lateral notches, as in the case of the connector 11, produce a plane of weakness through the insulator at each hole. Also as in the case of the connector 11, at each end of the connector 86, the insulator 87 includes a semi-cylindrical indentation 90 and end surfaces 91, 92, reflective of the reduced area insulator portions at each plane of weakness. In the electrical connector 86, the bottom of the insulator includes stand-offs such as 93, defining channels 94 and 96 to facilitate solder washing, as in the case of the standoffs of the connector 11.

Figure 9:
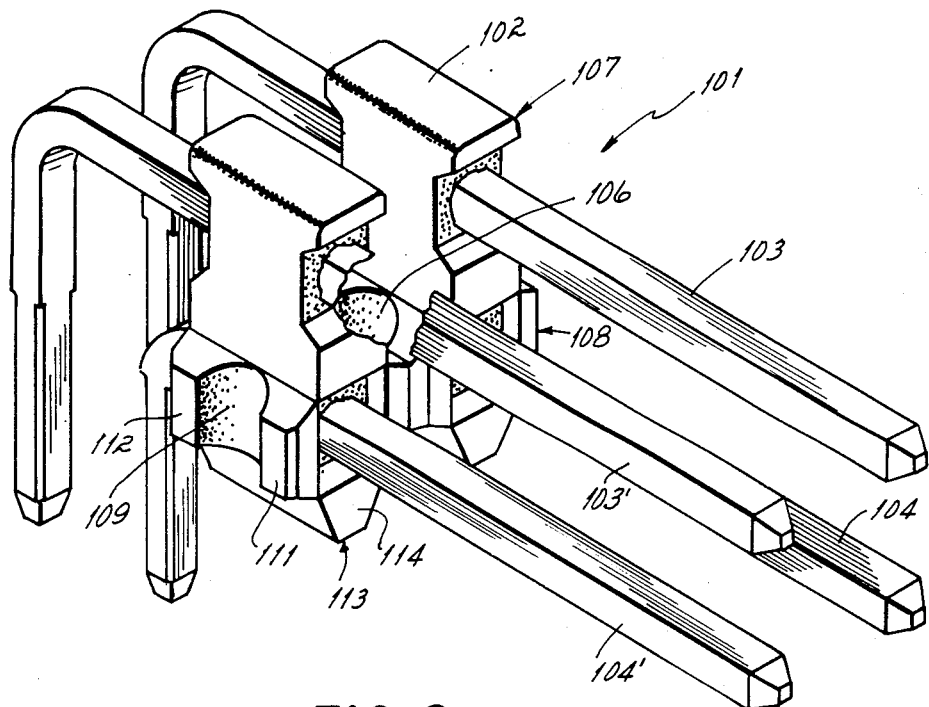
FIG. 9 is a perspective view of yet another alternative form of connector in accordance with the present invention.

With reference now to FIG. 9, a dual row, right angle electrical connector 101 includes an insulator 102 carrying two rows of pins 103, 104. As in the case of the connector 71 of FIG. 6, the pairs of pins 103, 104, and 103', 104', are each in a common plane perpendicular to the longitudinal axis of the connector 101, with holes 106 precisely intermediate these planes along a center line of the insulator 102. The pins 103 are received in an upper portion 107 of the insulator 102, and the pins 104 are carried by a lower portion 108 of the insulator. As in the case of the earlier-described connectors, each end of the connector 101 includes a semi-cylindrical indentation 109 in the insulator 102. On either side of the indentation 109 are reduced area end surfaces 111, 112, reflective of the reduced area portion of the insulator 102 adjacent each of the holes.

The lower portion of the insulator 102 of the connector 101 include circuit board-contacting bottom surfaces such as 113, at the bottom of stand-off portions such as 114 of the lower portion of the insulator 102.

Preferably the same peg 19 is used with a variety of types of insulator. As shown in FIG. 2a, a peg 19 includes three flanges 23-25 received within an aperture in a typical circuit board 12. Such a typical circuit board has a thickness of about 0.062 inches. Some circuit boards in present use have a lesser thickness, such as 0.040 inches. The thickness of such a circuit board 12' is shown in FIG. 2a. It can be seen that even in the case of this thinner circuit board 12', two peg flanges 23 and 24 are received within the aperture in the board.

Figure 2B:
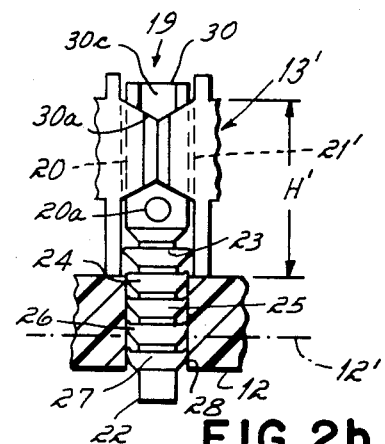
FIG. 2b is a cross-sectional view of an alternative form of the connector of FIG. 1.

As shown in FIG. 2b, some insulator bodies 13' for connectors constructed in accordance with the present invention may include a peg head-engaging portion higher than that of the insulator 13 and which maintains the peg 19 at a position further from the circuit board than is the case for the insulator 13 of FIG. 2a. For example, for one form of the insulator 13 of FIG. 2a, the height H of the insulator 13 is about 0.083 inches, while the height H' of the insulator 13' of FIG. 2b is about 0.117 inches. Due to the length of the lower portion 22 of the peg 19 and the number of flanges 23-27 thereon, with the peg in the position of FIG. 2b, the flanges 25-27 are received in an aperture in a standard circuit board 12. Further, for a reduced thickness board 12', as shown in FIG. 2b, the flanges 24-26 are received in the board aperture.

While the invention has been described in connection with unshrouded headers having pins received in apertures in a printed circuit board, it will be understood that it is also applicable to the mounting of other, related types of connectors on other substrates, such as, for example, for the surface mounting of connectors on ceramic substrates.

What is claimed is:

1. An electrical connector comprising:
   an insulator block having a bottom adapted to rest upon a printed circuit board-type substrate placed therebelow, the insulator block having a top spaced above the bottom;
   at least one row of electrically conductive pins spaced apart from one another and fixedly secured in the insulator block, each said pin having a first end below the bottom and extending from the insulator block in a first direction generally perpendicularly the bottom for electrical and mechanical connection to a printed circuit board-type substrate;
   the insulator block further including (a) a series of holes, a different one of which is located between each pair of adjacent pins in the row of pins, each said hole extending generally in the first direction and adapted to receive therethrough a peg for securing the insulator block to a printed circuit board-type substrate, and (b) a series of notches along the insulator block top, each said notch of the series of notches extending across and through a respective said hole of the series of holes, the holes and notches cooperating to produce planes of weakness spaced apart from one another along the insulator block and through the holes to facilitate breaking the insulator block at desired locations.

2. The electrical connector of claim 1, each said pin having a second end above the top and extending from the insulator block in a second direction for connection with another electrical connector and the like.

3. The electrical connector of claim 1, the insulator block further having a first side and a second side between the top and bottom, the insulator block further including a second series of notches along one of the bottom, the first side and the second side, each notch of the second series of notches in a respective said plane of weakness to further facilitate breaking the insulator block at desired locations.

4. The electrical connector of claim 1, the insulator block further having a first side and a second side between the top and bottom, the insulator block further including a second, a third and a fourth series of notches along the bottom, the first side and the second side respectively, each notch of the second, third and fourth series of notches in a respective said plane of weakness to further facilitate breaking the insulator block at desired locations.

5. The electrical connector of claim 2, said second direction being 90° relative to said first direction.

6. The electrical connector of claim 2, said second direction being opposite said first direction.

7. The electrical connector of claim 1 wherein the insulator block is unshrouded.

8. The electrical connector of claim 1, each said notch of the series of notches being transverse said row of pins.

9. The electrical connector of claim 1, each said notch adapted to receive therein a head of a peg so that when a peg is received in a said hole, the peg head does not extend above the top of the insulator block.

10. The electrical connector of claim 9, each said notch of the series of notches being transverse said row of pins.

11. The electrical connector of claim 1 further including:
an electrically non-conductive peg extending through said any one hole in the insulator block, said peg including a head sized to engage the insulator without passing through any one of said plurality of holes and a substrate-gripping portion extending beyond the insulator block in the first direction and adapted to grip the interior sidewall of an aperture in a printed circuit board-type substrate.

12. The electrical connector of claim 11, the peg substrate-gripping portion including a series of resilient flanges adapted to frictionally engage the interior sidewall of an aperture of a printed circuit board-type substrate.

13. The electrical connector of claim 9 further including:
an electrically non-conductive peg extending through said any one hole in the insulator block, said peg including a head sized to fit within a said notch and engage the insulator block below the top thereof without passing through any one of said plurality of holes and a substrate-gripping portion extending beyond the insulator block and adapted to grip the interior sidewall of an aperture in a printed circuit board-type substrate.

14. The electrical connector of claim 13, the peg substrate-gripping portion including a series of resilient flanges adapted to frictionally engage the interior sidewall of an aperture of a printed circuit board-type substrate.

15. An electrical connector comprising:
an insulator block having a bottom adapted to rest upon a printed circuit board-type substrate placed therebelow, the insulator block having a top spaced above the bottom;
at least one row of electrically conductive pins spaced apart from one another and fixedly secured in the insulator block, each said pin having a first end portion below the bottom and extending from the insulator block in a first direction generally perpendicularly the bottom for electrical and mechanical connection to a printed circuit board-type substrate;
the insulator block further including (a) a series of holes, a different one of which is located between each pair of adjacent pins in the row of pins, each said hole extending generally in the first direction, and (b) a series of notches along the insulator block top, each said notch of the series of notches extending across and through a respective said hole of the series of holes, the holes and notches cooperating to produce planes of weakness spaced apart from one another along the insulator block and through the holes to facilitate breaking the insulator block at desired locations; and
at least one non-conductive substrate-gripping peg means, below the bottom of the insulator block and extending from the insulator block in the first direction, adapted to grip the interior sidewall of a printed circuit board-type substrate aperture for mechanically securing the connector to a printed circuit board-type substrate upon which the insulator block bottom is rested and to which the pin first end portions are electrically and mechanically connected.

16. The electrical connector of claim 15, each said pin having a second end above the top and extending from the insulator block in a second direction for connection with another electrical connector or the like.

17. The electrical connector of claim 16, said second direction being 90° relative to said first direction.

18. The electrical connector of claim 16, said second direction being opposite said first direction.

19. The electrical connector of claim 16, the insulator block further having a first side and a second side between the top and bottom, the insulator block further including a second series of notches along one of the bottom, the first side and the second side, each notch of the second series of notches in a respective said plane of weakness to further facilitate breaking the insulator block at desired locations.

20. The electrical connector of claim 16, the insulator block further having a first side and a second side between the top and bottom, the insulator block further including a second, a third and fourth series of notches along the bottom, the first side and the second side respectively, each notch of the second, third and fourth series of notches in a respective said plane of weakness to further facilitate breaking the insulator block at desired locations.

21. The electrical connector of claim 15, each said notch of the series of notches being transverse said row of pins.

22. The electrical connector of claim 15 wherein the insulator block is unshrouded.

23. The electrical connector of claim 15, the peg means comprising a series of resilient flanges adapted to frictionally engage the sidewall of a printed circuit board-type substrate aperture.

* * * * *